United States Patent
Kiryu

(10) Patent No.: US 7,461,309 B2
(45) Date of Patent: Dec. 2, 2008

(54) SYSTEMS AND METHODS FOR PROVIDING OUTPUT DATA IN AN LBIST SYSTEM HAVING A LIMITED NUMBER OF OUTPUT PORTS

(75) Inventor: Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/313,097

(22) Filed: Dec. 20, 2005

(65) Prior Publication Data

US 2007/0143651 A1    Jun. 21, 2007

(51) Int. Cl.
*G01R 31/28* (2006.01)
(52) U.S. Cl. ................... 714/729; 714/724; 714/726; 714/732
(58) Field of Classification Search ............. 714/726, 714/729, 732
See application file for complete search history.

(56) References Cited

U.S. PATENT DOCUMENTS

| | | | |
|---|---|---|---|
| 6,240,537 B1 | 5/2001 | Sim | |
| 6,671,644 B2 | 12/2003 | Huisman et al. | |
| 6,715,105 B1 * | 3/2004 | Rearick | 714/30 |
| 6,807,645 B2 | 10/2004 | Angelotti et al. | |
| 7,099,783 B2 * | 8/2006 | Hasegawa et al. | 702/57 |
| 7,237,162 B1 * | 6/2007 | Wohl et al. | 714/726 |
| 2005/0097419 A1 * | 5/2005 | Rajski et al. | 714/742 |
| 2007/0089004 A1 * | 4/2007 | Gloekler et al. | 714/733 |

OTHER PUBLICATIONS

Barnhart et al., OPMISR: The Foundation for Compressed ATPG Vectors, Oct.-Nov. 2001, IEEE, pp. 748-757.*
Barnhart et al., Extending OPMISR beyond 10× scan test efficiency, Sep.-Oct. 2002, IEEE, vol. 19, Issue 5, pp. 65-73.*
Chickermane et al., Channel masking synthesis for efficient on-chip test compression, 2004, IEEE, pp. 452-461.*
Riley et al., Testability features of the first-generation Cell processor, Nov. 8-10, 2005, IEEE, pp. 1-9.*

* cited by examiner

*Primary Examiner*—Cynthia Britt
*Assistant Examiner*—John J Tabone, Jr.
(74) *Attorney, Agent, or Firm*—Law Offices of Mark L. Berrier

(57) ABSTRACT

Systems and methods for performing logic tests in digital circuits with means for segmentation and output of data through limited I/O ports. In one embodiment, a system includes test circuitry coupled to target logic under test, where the test circuitry is configured to perform logic tests on the target logic using input data and thereby generate signature data. The system includes a first number of I/O ports that are shared for input and output and alternately convey the input data to the test circuitry and output the signature data generated by the test circuitry. The signature data includes a second number of bits greater than the number of I/O ports. The test circuitry is configured in a first mode to successively output multiple segments of the signature data through the I/O ports, where each segment has a number of bits no greater than the number of I/O ports.

19 Claims, 5 Drawing Sheets

SYSTEMS AND METHODS FOR PROVIDING OUTPUT DATA IN AN LBIST SYSTEM HAVING A LIMITED NUMBER OF OUTPUT PORTS

BACKGROUND

1. Field of the Invention

The invention relates generally to the testing of electronic circuits, and more particularly to systems and methods for using test circuitry (some components of which are built into the device under test) to identify the existence of circuit defects and to provide data to localize the defects in the device under test, including the means for data transfer through a limited number of I/O ports.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is a deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and number of states is large, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs generated in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

Deterministic testing approaches can be implemented using design-for-test (DFT) methodologies. DFT methodologies impact the actual designs of the circuits that are to be tested. DFT methodologies may use various approaches, and may incorporate all of the test circuitry, or only parts of the circuitry into the device under test. Logic built-in self-test (LBIST) methodologies in particular involve incorporating essentially all of the test circuitry components into the design of the device to be tested. Other methodologies (e.g., OpMISR and MOXIE) incorporate a portion of the test circuitry components into the device under test.

In a typical OPMISR or MOXIE system, test circuitry within a device under test includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic (at some test rate) to a subsequent scan chain. The data is then scanned out of the subsequent scan chain and compressed to reduce storage and bandwidth requirements (e.g., through the use of a multiple input signature register.) This test loop is typically repeated many times (e.g., 10,000 iterations,) with the results of each test loop being combined in some manner with the results of the previous test loops. After all of the scheduled test loops have been completed, the final result is compared to a final result generated by a device that is known to operate properly operated in an identical test (using identical input data processed at the same test rate.) Based upon this comparison, it is determined whether the device under test operated properly.

This conventional configuration has some drawbacks, however. Since the number of output ports is limited (e.g., using the input ports for output), the output bandwidth needs to be reduced and is done so by combining the test output bits. This compression of the functional logic output results in a loss of some of the information content.

For example, four functional blocks within a device under test each produce a 32 bit wide signature by means of a multiple input signature register (MISR). (Assume there are 32 output ports available.) Each of the four MISRs can be compacted from 32 bits to 8 bits and concatenated so that a total of 32 bits is output. In another example, the four MISR signatures are OR'd together, reducing the number of bits from to 32. Consequently, data errors that propagated into the signature value in a particular MISR can no longer be identified when combined with other MISR results. In another example, only 8 ports are available, and, instead of concatenation, the 4 compacted MISR signatures are combined and compacted into an 8-bit signature. Again, any error localization information originally preserved within the MISR signatures would then be corrupted.

The lost information can be valuable in determining the root cause of the malfunction so that the defects can be eliminated or their effect mitigated. It would therefore be desirable to provide systems and methods able to test the circuitry and provide results, without having to resort to data compression.

SUMMARY OF THE INVENTION

One or more of the problems outlined above may be solved by the various embodiments of the invention. Broadly speaking, the invention comprises systems and methods for performing logic tests in digital circuits where data resulting from the testing is divided into subsets that are sequentially output through limited I/O ports. In one embodiment, the test circuitry of a target circuit is initialized and executes tests on four blocks of functional logic. Each block of functional logic generates a separate test signature. Each of the test signatures is then output in turn through the limited number of available output ports.

The invention may be implemented in a variety of ways, and various exemplary embodiments will be described in detail below. In one embodiment, the device to be tested is connected to a test bench, or ATE (automated test equipment.) The ATE provides test data (e.g., bit patterns) to OpMISR or MOXIE test circuitry in the device. The test circuitry of the target circuit is initialized with data from the ATE. The ATE controller then commands the execution of multiple test loops. During each test loop, the ATE controls the generation of input bit patterns, the loading of these bit patterns into the LBIST scan chains, and the propagation of the input bit patterns through the functional logic and capture of computed results in the scan chains. The computed results, having been stored in the scan chains, are scanned out of the scan chains and into MISR's associated with each target block of functional logic. In each MISR, a data signature is generated. The signature of each of the MISRs is then output to the ATE, in turn, through the available output ports. These signatures are output over multiple cycles at the end of the test loop.

One alternative embodiment comprises a system having target logic with test circuitry incorporated therein as in the immediately preceding example. Additionally, the test circuitry incorporates compression circuitry coupled to the four MISR's. The compression circuitry is configured to combine the data signatures so that the compressed result can be output on the available ports, in a single cycle. The system is operable to output either the multiple uncompressed LBIST signatures or the single compressed result. Circuitry in the ATE is able to compare the output (compressed or uncompressed) with the corresponding output of a circuit known to operate properly. If they are identical, then testing proceeds. If a difference is detected, error handling may be performed, possibly including processing each of the signatures to provide information localizing the sources of the differences.

Another alternative embodiment comprises a method implemented in a device which incorporates circuitry for logic testing. The method includes performing one or more test loops. In each test loop, input data is received through a set of shared input/output (I/O) ports. There are only a limited number of I/O ports. Testing is performed on functional logic within the device using the input data to generate test data, where the test data contains a number of bits greater than the number of I/O ports. In a first mode, the test data is output through the I/O ports in a plurality of successive segments, where each segment comprises a portion of the test data. In a second mode, the test data is compacted into a single signature containing a number of bits no greater than the number of I/O ports. This compacted signature is output as a single value.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
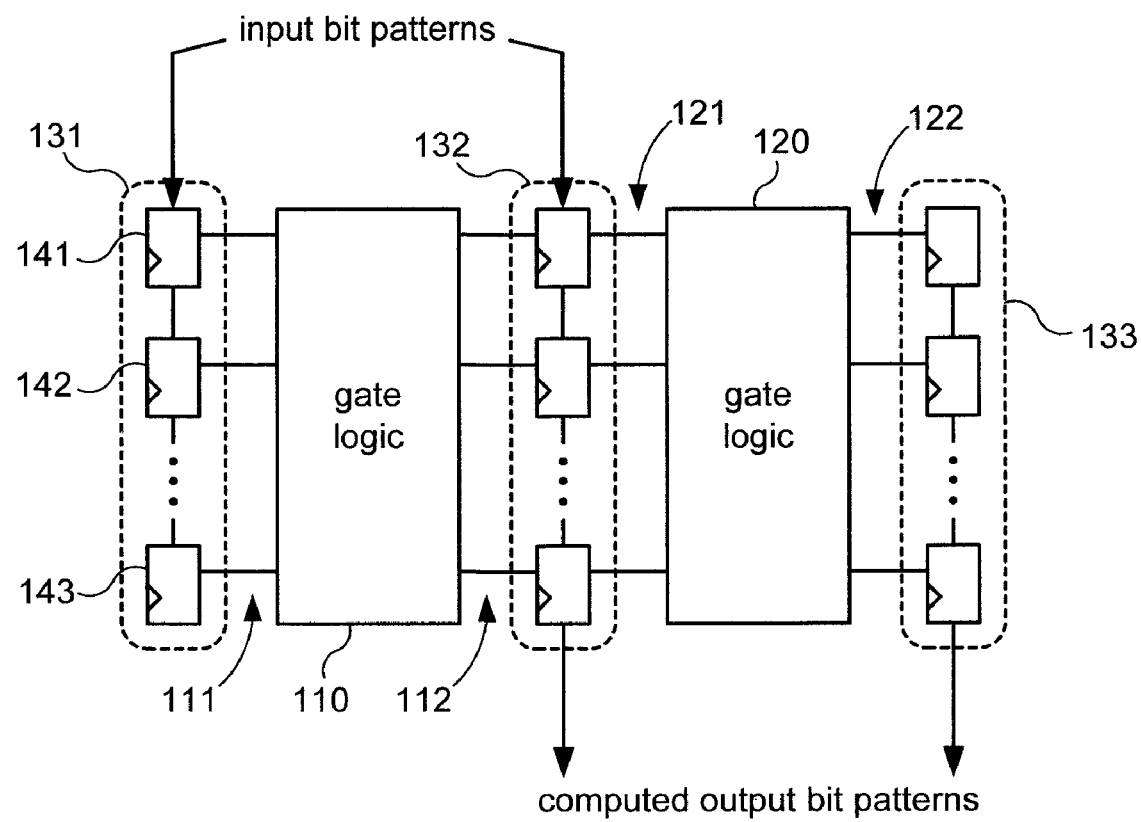
FIG. 1 is a functional block diagram illustrating the principal operation of scan chains in a simple test system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods associated with logic test circuitry to identify the existence of logic circuit defects and provide data to facilitate localizing the defects in the device under test.

In one embodiment, test circuitry, in conjunction with automated test equipment (ATE) is used to process input bit patterns through several blocks of target logic within one device, capturing and then outputting the resulting computed bit patterns. The test circuitry of the ATE includes a clock control block (CCB), state machine control block (SMCB), and a pattern generator. The test circuitry of the target device includes scan chains, multiple signal input generators (MISR's) and space compactor blocks (SCB's). (Some test circuitry can be on either or both the ATE and the device.)

The device is connected to the ATE and the pattern generator is initialized with parameters from the ATE. After scanning the input patterns from the pattern generator into the scan chains, the ATE controller then executes the functional logic. That is, the input patterns are propagated through the blocks of functional logic, producing output patterns for each block. These computed results, having been captured in the scan chains, are scanned into their respective MISR's. Each of the MISR's generates a data signature for its associated block. Errors in the signatures generated by the different MISR's indicate that the corresponding target blocks of functional logic malfunctioned.

In this embodiment, the aggregate number of bits in the MISR signatures generated for each of the blocks of functional logic is greater than the number of I/O ports that are available to output the data. Conventionally, this problem would be addressed by compacting the signature data into a number of bits that is no larger than the number of I/O ports available for output. The compaction of the signature data, however, causes the loss of error localization information (i.e., it is no longer known which bits of which MISR signatures were incorrect, so it is not known which functional logic malfunctioned.) The present systems and methods therefore enable the output of the signature data in a series of sequentially output subsets of the data. For example, the system may output the signature of a first MISR, then the signature of a second MISR, and so on until all of the signature data is output.

The uncompressed signature data may be sequentially output at the end of every test loop, or it may be done selectively. In one embodiment, a user can select either a first mode in which the signature data is compressed and output as a single set of bits, or a second mode in which the uncompressed signature data is output as a series of subsets of the data. Alternatively, a system may be configured to output compressed signature data until an error is detected, and then switch to a diagnostic mode in which the uncompressed signature data is output in multiple subsets of bits.

Various embodiments of the invention will be described below. Primarily, these embodiments will focus on implementations of an architecture that is similar to a STUMPS-type LBIST architecture which is implemented within an integrated circuit. It should be noted that these embodiments are intended to be illustrative rather than limiting, and alternative embodiments may be implemented in other types of architectures, and may also be implemented in circuits whose components are not strictly limited to logic components (e.g., AND gates, OR gates, and the like.) Many such variations will be apparent to persons of ordinary skill in the art of the invention and are intended to be encompassed by the appended claims.

Referring to FIG. 1 a functional block diagram illustrating the principal operation of a simple test system is shown. The test system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality of outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The test system of FIG. 1 operates basically as follows. Test bit patterns are generated and are scanned into the scan chains (131, 132) that are coupled to the inputs of functional logic 110 and 120. The test bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
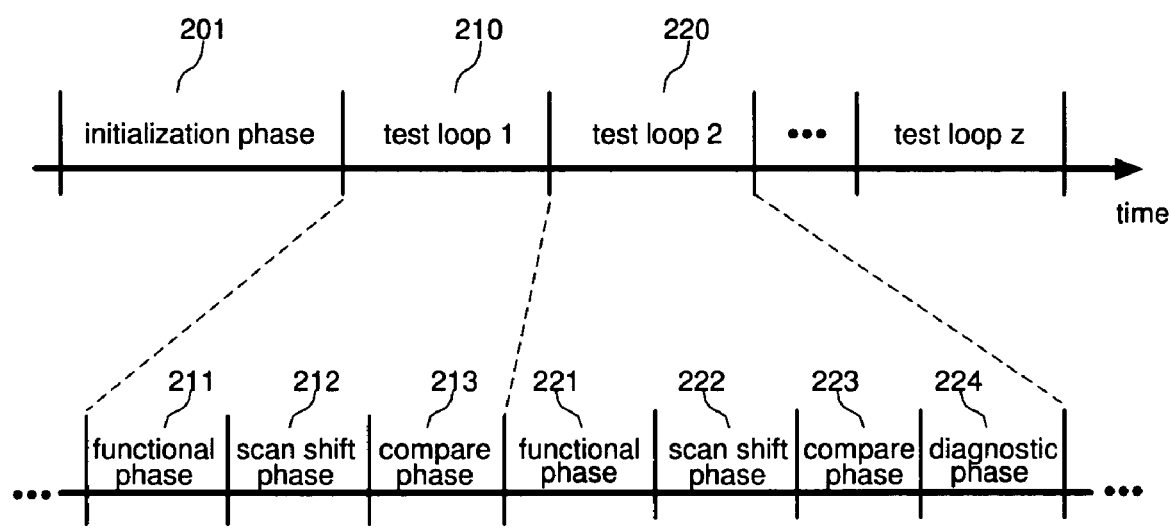
FIG. 2 is a diagram illustrating the phases of operation of the test system in accordance with one embodiment.

Referring to FIG. 2, a diagram illustrating the phases of operation of the test system in accordance with one embodiment is shown. In this embodiment the device under test is attached to an ATE which provides input (e.g., clock signals, data, power, etc.) to the device and accepts output from the device. FIG. 2 shows several different phases of operation of the test system. Nominally, there are initialization, functional, scan-shift, and compare phases. A compare phase occurs at the end of the scan-shift phase and may be followed by a diagnostic phase which may itself contain the aforementioned phases.

In initialization phase 201, the various components of the system are prepared for normal test operation (i.e., execution of a first test loop 210 followed by a second test loop 220, and so forth.) This may include resetting various components, scanning (loading) values into the scan chains from a bit pattern generator, setting values in registers, and so on. In functional phase 211, data which has propagated through the functional logic of the device under test is captured in the scan chains. In scan-shift phase 212, new data is scanned into the scan chains of the test system while captured data is scanned out of the scan chains. The data is scanned out into one or more MISR's. The MISR signatures are then output (possibly in some compacted form) during compare phase 213. If an error is detected, the operation of various components of the test system is (temporarily) suspended to enable analysis of data within the system. The operation of the components may be subsequently restarted to localize the defect or to continue testing with different input test patterns.

As a shown in the FIG. 2, operation of the test system begins with initialization phase 201. As noted above, the various components of the system are prepared for normal operation during this phase. It may be necessary to ensure that several registers (e.g., test counter register, scan-shift counter register, bit monitor register) have the appropriate values stored therein. Because the first test loop (210) of the embodiment depicted in FIG. 2 begins with a functional phase (211,) it is also necessary in the initialization phase to generate a first set of test bit patterns and to load these bit patterns into the scan chains that are interposed between the functional logic of the device under test. After these initial operations are performed, the test system is ready for operation.

Following initialization phase 201, the test system begins a first test loop 210 that includes functional phase 211, a scan shift phase 212, and a compare phase 213. At the end of a functional phase, the resulting captured data is scanned out of the scan chains and examined (during the subsequent compare phase.) During the compare phase of a test loop (e.g., 213, 223), data that is scanned out of the scan chains is examined to determine if an error occurred. If necessary, the testing may be suspended, or halted, to enable diagnosis of malfunctions using the available data (in a diagnostic phase such as 224.)

A compare phase may be followed by a diagnostic phase (such as 223 and 224, respectively.) The diagnostic phase itself can also contain the phases described above. A diagnostic phase (224) may include only data forwarding, or it may include an iterative set of phases designed to localize a defect that gave rise to the error. If the examination of the MISR signature or other data indicates that the functional logic of the device under test operated properly during the first test loop 210, the system proceeds to a second test loop 220 (again beginning with a functional phase) and continues until the requisite test termination conditions (e.g., detection of an error or completion of a predetermined number of test loops) are met.

During functional phases 211 and 221, the data that was scanned into the scan chains is propagated through the functional logic of the device under test. After a certain interval (e.g., one clock cycle if the device is being tested at normal operational speed,) the resulting data is captured in the scan chains. (As noted above, a scan chain that is positioned between successive functional logic blocks serves to both provide inputs to one of the functional logic blocks and capture the outputs of the other functional logic block.) Thus, at the end of a functional phase, the output of the functional logic resides in the scan chains. The data that is captured in the scan chains at the end of the functional phase is then scanned out of the scan chains during the following scan-shift phase (e.g., 212 and 222.) At the same time the captured data is scanned out of the scan chains, input bit patterns are scanned into the scan chains to prepare for the functional phase of the next test loop.

The captured data is scanned out of the scan chains and into the MISR's. The MISR's are configured to generate test signatures by combining the data received from the scan chains with data that already resides in the MISR's. Typically, as each bit is received from a scan chain, that bit is XOR'ed with a bit that is already stored in the MISR. The resulting bit is then XOR'ed with the next bit that is received. The set of bits in each MISR (the MISR signature) is therefore dependent upon the bits that are received form the scan chains.

If the same set of bits are received by two identically configured MISR's, they will generate the same signature. Consequently, the signature generated by a device under test should be the same as the signature generated by a good device that is running in parallel with the device under test. (Data that was previously generated by a good device could also be used as the basis for determining whether the device under test generated the correct MISR signatures.)

In the present systems and methods, the aggregate number of bits in the MISR signatures generated by the test circuitry is greater than the number of I/O ports that are available for output. Depending upon the mode that is selected, either the MISR signatures are compacted into a single set of bits that can be output simultaneously, or the signatures are divided into subsets that can be output sequentially (e.g., the first MISR signature is output, followed by the next signature, and so on. (This will be described in more detail below.) The data that is output is then compared with the data generated by a good device in order to determine whether the device under test has functioned properly.

In one embodiment, the compressed signature data is initially compared in compare phase 213. If no error is detected in compare phase 213 (if the combined signature matches a known, correct one) the next test loop will proceed using input bit patterns already loaded in the scan chains.

If the combined signature does not match the expected signature, the device under test has malfunctioned, and the system enters a diagnostic phase. In this embodiment, the scan shift operations of the test system are halted (or temporarily suspended) during the compare phase (e.g., 213) and the diagnostic phase (e.g., 214). While these operations are suspended, the state of the system is maintained, so that the system can be examined and the scan shift operations can be resumed after the compare or diagnostic phases without having to completely re-initialize the system. During the diagnostic phase, the data that was captured in various registers, the scan chains, and the MISR's can be processed and examined to help determine the location of the malfunction within the logic block. In particular, each of the functional blocks has a MISR signature that can be output in turn and examined to localize a malfunction to a particular block.

If an error is detected and additional functional phases are required during a diagnostic phase, the MISR's and pattern generator will be set to appropriate states and diagnostic input patterns will be scanned into the scan chains for the analysis. At the end of that analysis, the MISR's and pattern generator can be reset to the state that existed prior to the diagnostic phase, and the corresponding input bit pattern can be regenerated in preparation for the second test loop. This process can be carried out similarly for all test loops as necessary.

Figure 3:
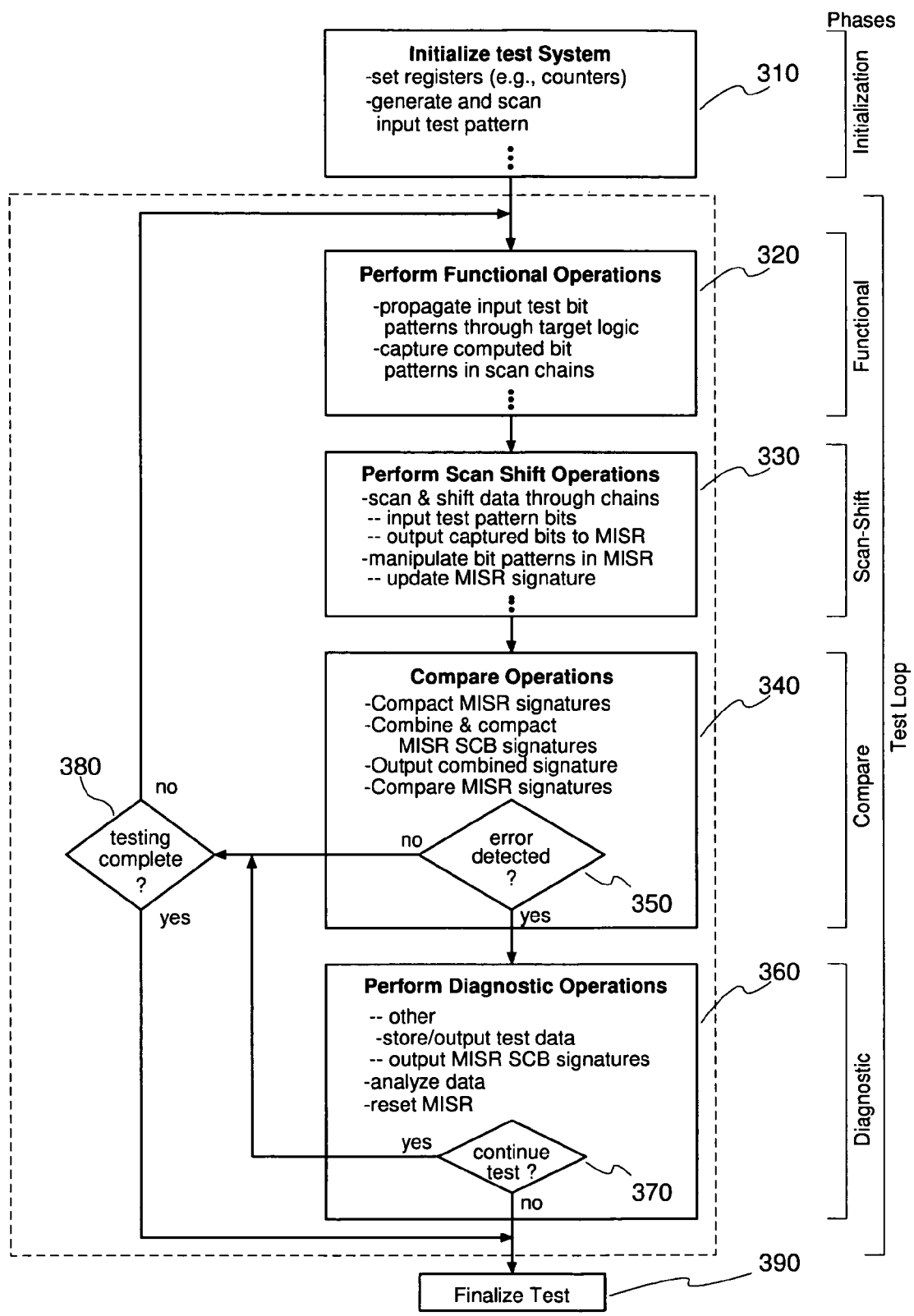
FIG. 3 is a diagram illustrating the operations within each phase in accordance with one embodiment.

The operation of the test system is summarized in FIG. 3. This figure is a flow diagram illustrating the initialization of the system and the repeating test loops that are performed. Also illustrated are the major decision points for each test loop.

Referring to FIG. 3, operation of the system begins with the initialization of the test components (block 310.) The pattern generator state is initialized and used to produce input test patterns. After the system is initialized, a functional phase (block 320) is executed, including propagating input data from the scan chains through the functional logic and capturing the resulting bit patterns in the scan chains. Next, the system executes a scan shift phase (block 330) in which each of the bits of the captured bit patterns are scanned out of the scan chains. At the same time, the bits of an input bit pattern are scanned into the scan chains in preparation for the next functional phase. The captured bits scanned out of a particular block's scan chains are used to update the MISR signature bits of the MISR associated with that block. Next, each of the MISR signatures are compacted. (The compaction can be performed in or across the scan-shift and compare phases.) This compacted signature data is output and compared (350) with the corresponding signature data of a good device during the compare phase (block 340). During the compare phase the functional and scan shift operations of the system are suspended. If no difference is detected between the signature data of the good device and the device under test, the system continues by entering the next test loop (350 to 380 to 320.) If all test loops have been performed, the testing terminates (380 to 390.)

If an error is detected in the combined signature (350), the system enters a diagnostic phase (block 360.) During the diagnostic phase, the compacted MISR signatures associated with each of the logic blocks are output for analysis. The diagnostic phase may also collect other data, execute additional functional and scan-shift phases to generate data, perform various analyses, terminate the test, continue with the next scheduled test loop, or some combination of these. For example, additional tests may be executed, or scan shift phases of varying length can be performed to provide additional information that further localizes the defect to a particular segment of the scan chains.

Figure 4:
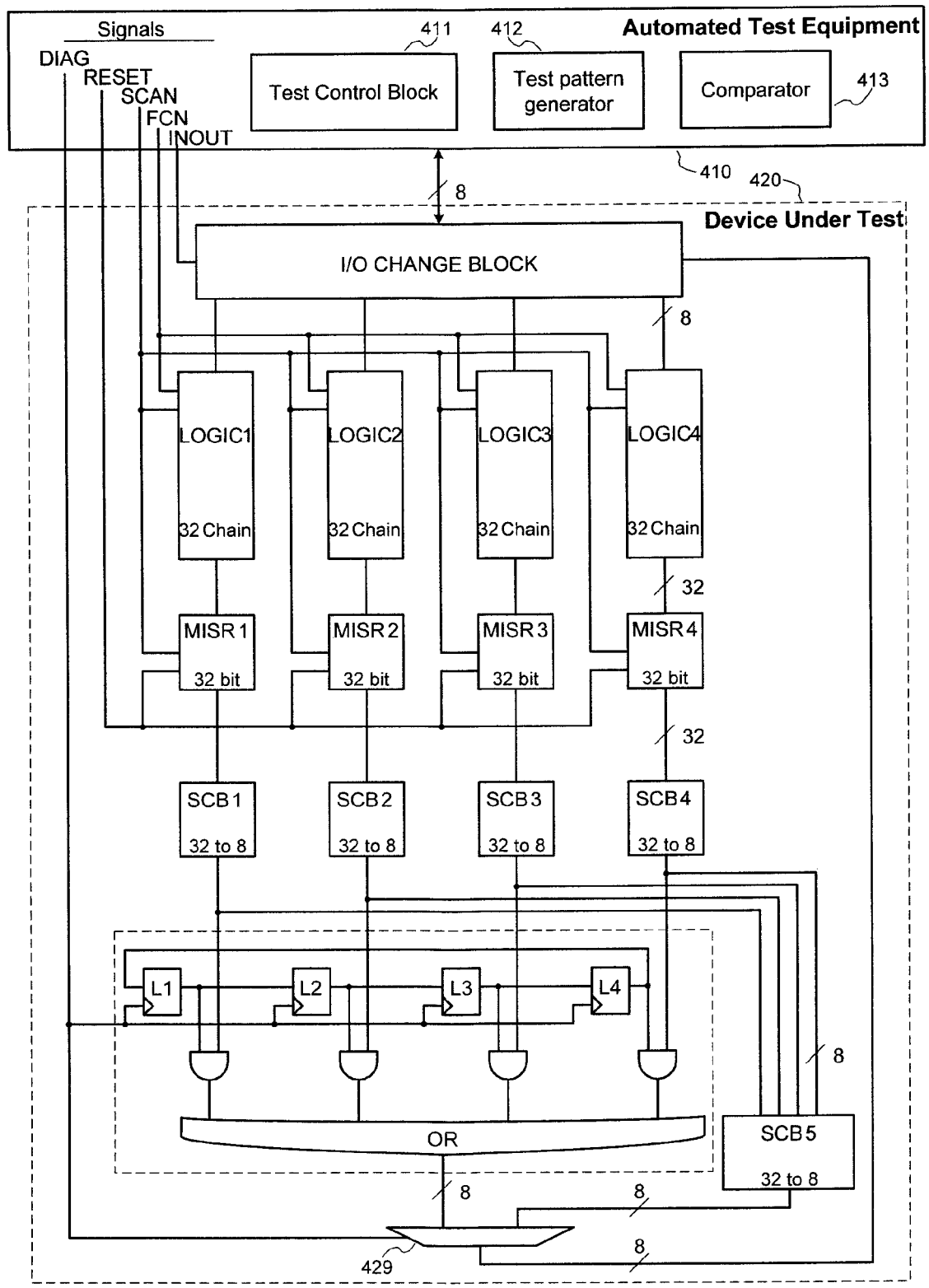
FIG. 4 is a functional block diagram illustrating a test architecture that can be used in conjunction with the testing of logic circuits in accordance with one embodiment.

In one embodiment, the test system is implemented as shown in the functional block diagram of FIG. 4. As depicted, the STUMPS type architecture comprising the test pattern generator, scan chains, and MISR's, is split between an ATE (automated test equipment) 410 and a DUT (device under test) 420. Test controller 411, test pattern generator 412 and comparison logic 413 are illustrated as part of ATE 410. DUT 420 is depicted with blocks of functional logic, multiple input signal registers, and space compactor blocks (e.g., LOGIC1, MISR1, and SCB1, respectively). Each set consisting of a block of functional logic (with scan chains,) a MISR and a space compactor block can be considered a test satellite. The different test satellites are commonly controlled by the ATE and function in essentially the same manner, but with respect to different portions of the functional logic of the device under test. It should be noted that, while only four test satellites are depicted, there may be more (or fewer).

Each block of functional logic has a set of scan chains interspersed in the target logic, as described above in connection with FIG. 1. These blocks need not be functional equivalents and may have various numbers of scan chains in the test system design. The functional blocks are accompanied by logic to compact and output the MISR signatures. Other components are not illustrated and may include various counters and registers, such as a test loop counter and register, scan-shift counter and register, and so on. Also, all or some of the components may reside on-chip with the target logic. These test components may, in different embodiments, be part of ATE 410 or be integrated with logic circuit 420 which the test components are designed to test.

Test controller 411 includes circuitry to control the operation of the remainder of the test components. For purposes of clarity, the structure of test controller 411 is simplified in the figure and only a few signals to some of the other test components within Logic 420 are shown. The controller typically has many components and additional connections that are coupled directly to each of the test components. Test controller 411 also performs functions that are not illustrated or described in detail, such as providing seed values to test pattern generator 412.

The sequence of bits generated by test pattern generator 412 is the input pattern which will be propagated through the functional logic components of logic circuit 420. The test sequences are therefore provided to each of the scan chains interspersed within the target logic. There are various kinds of test pattern generators. A test pattern generator can, for example, be implemented by simply reading stored bit patterns from memory. Alternatively, the bit patterns can be generated during the testing (e.g., as a linear feedback shift register, LFSR, that generates pseudorandom bit patterns.) It should be noted that other components may be incorporated at this stage. For instance, the test bit sequences can be processed by a phase shifter to alter the bit patterns prior to being loaded into the scan chains. Here, an I/O change block is illustrated.

The pseudorandom bit patterns that are generated by test pattern generator 412 are loaded into the scan chains by means of an I/O change block. The I/O change block also serves as a spreader. This block serves as the interface to the shared (input and output) ports and also distributes the input patterns to the different sets of scan chains. The I/O change block receives input from the ATE over an 8-bit wide path (8 ports) and then spreads the bits of the input pattern over the 4 functional logic blocks.

The manner in which the I/O change block spreads the bit patterns across the scan chains of the different test satellites may differ from one embodiment to another. In an OPMISR+ design, the 8 input bits are distributed in a fixed, but irregular mapping to the scan chains. For example, if the 8 bits are spread across 128 scan chains, bit 0 may be mapped to scan chains 5, 11, 20, 23, 37, . . . , while bit 1 is mapped to scan chains 2, 6, 15, 24, 35, . . . , and so on. In a MOXIE design, the input bits are distributed in a more dynamic way. More specifically, in this type of system, a portion of the bits (e.g., 2) are used as a control input to multiplex (e.g., 4:1) another portion of the bits to select an input bit for each scan chain. Other mechanisms for distributing the bits across the scan chains may also be used.

In the embodiment of FIG. 4, each block of target logic (e.g., LOGIC1) has 32 input scan chains of some length. Each of the scan chains comprises a series of scan latches that are configured to alternately shift data (the pseudorandom bit patterns or functional logic output) through the scan chains, or to capture data that has been propagated through the functional logic. Each of the scan chains is positioned before and/or after (interposed with) respective portions of target logic circuitry LOGIC1, for example. Thus, for each portion of logic circuit LOGIC1 to be tested, there is a scan chain that precedes this portion to provide inputs to the corresponding logic, as well as a scan chain which follows this portion and captures the output of the corresponding logic. (See FIG. 1.)

After the pseudorandom bit patterns have been allowed to propagate through the functional components of a target logic circuit (e.g., LOGIC1) and the results have been captured in the scan chains, the contents of the scan chains are scanned out of the scan chains. In other words, they are unloaded from the scan chains to the corresponding MISR (e.g., MISR1) whose signature is then propagated through the corresponding space compactor block (e.g., SCB 1.) In alternative embodiments, more complex circuitry may allow the number of bits passed to the MISR to be reduced, thereby reducing the size of the MISR. The MISR may also be designed to output a signature of a reduced number of bits, obviating the need for the space compactor block.

The bits from scan chains within the target logic circuit (e.g., LOGIC1) are provided to the MISR (e.g., MISR1) to provide a means to observe test results and to compare this information. Typically, a MISR generates a cumulative value that is based upon the output of the scan chains at each cycle. For example, in one embodiment, a MISR performs a modulo operation on the output of the scan chains. That is, the MISR divides the current value stored in MISR by the output of the scan chains, and retains the remainder from this computation. This computation is performed and the value stored in the MISR is updated during each scan cycle. The cumulative value stored in the MISR (the signature) is then examined after some number of scan cycles (possibly spanning a number of tests).

The test data stored in the MISR space compactor blocks (SCB1-SCB4,) and an additional space compactor block (SCB5) can be read out of the device through the shared input/output ports. In this embodiment, the MISR signatures are compacted in the MISR space compactor blocks (e.g., SCB1) to reduce the number of signature bits of each MISR from 32 to 8. The output of each MISR space compactor block can be further combined with the output of all other MISR space compactor blocks using the additional space compactor block (SCB5). This combined signature can then be output and examined to determine if it is necessary to output the individual MISR space compactor block signatures (from SCB1, SCB2, SCB3, and SCB4). If needed, each of these MISR space compactor block signatures can be output in turn. An alternative to compacting the MISR signatures (using SCB's 1-4) is to split the signatures into segments that can be each output in turn. For example, the four 32-bit signatures could be split into sixteen 8-bit segments to be output over the 8 available output ports.

ATE access to the signatures allows them to be compared to values stored within ATE 410. As pointed out above, these values can be generated by, e.g., the target logic within another device which is presumed to operate properly. If a signature value generated from the device under test (e.g., logic circuit 420) does not match this stored signature, then one or more of the operations performed by the functional components of the device under test must have failed. An incorrect data bit is thereby set in the output scan chain, which then propagated to one of the MISR's and space compactor blocks, which resulted in a signature different from that of the properly generated one stored in the ATE. An analysis of the error could then use test data such as the MISR space compactor block signatures to localize the malfunction (e.g., to the logic associated with a particular MISR). This information, in conjunction with information generated/stored elsewhere in the test circuitry, may further localize the defects in the target functional logic.

The operation of test components within ATE 410 and device under test 420 is controlled by test controller 411, which generates the control signals necessary to execute the phases of operation depicted in FIG. 2 (i.e., the initialization, function, scan shift, compare, and diagnostic phases.) In one embodiment, test controller 411 is configured to generate control signals by selectively gating a clock signal which is generated by a PLL employing a clock control block and state machine control block. As depicted in FIG. 4, these signals include the I/O (INOUT), functional (FCN), scan-shift (SCAN), and diagnostic (DIAG) signals. INOUT sets the I/O change block to either receive (input) test input bit patterns or output test signature data. SCAN causes bit patterns from the I/O change block to be propagated through the scan chains while, at the same time, propagating captured results out of the scan chains into a MISR. FCN causes the input patterns which propagate through the targeted functional logic to be captured in adjoining scan chains. DIAG selects successive ones of the signatures of the individual MISR space compactor blocks and sets multiplexer 429 to forward these to the I/O change block. (When DIAG is not asserted, the combined output from SCB5 is sent through multiplexer 429 to the I/O change block.) RESET resets the MISR's to a known state.

It should be noted that while the embodiment depicted in FIG. 4 determines whether the data contains errors by comparing it to stored data previously generated by a "good" device, alternative embodiments may determine the existence of errors in other ways. Because of the very large amounts of data that would have to be stored, this is not believed to be as practical a solution as the comparison to data that is generated by a "good" device running in parallel with the device under test. The "live" comparison has the advantage of providing as little or as much data as is needed. For instance, the live comparison could continue to provide data for tests that continued for an indefinite period of time.

It should also be noted that, while the embodiment of FIG. 4 makes the comparison in the ATE, alternative embodiments may not. For example, one alternative embodiment may be configured to compare data on-chip, outputting the signatures when it is necessary to perform a diagnostic procedure.

Figure 5:
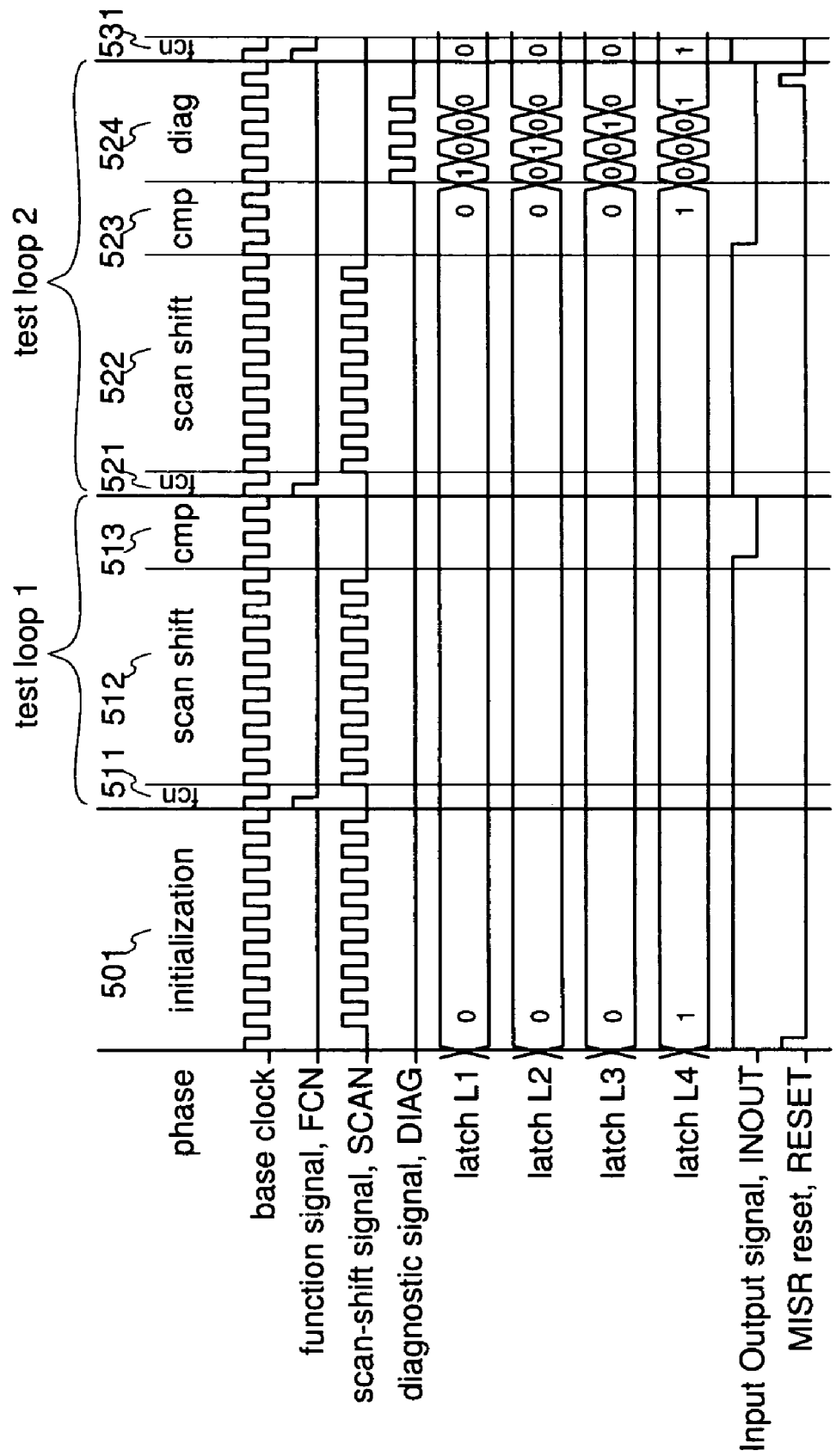
FIG. 5 is a timing diagram illustrating register values and signals associated with one embodiment.

FIG. 5 is a timing diagram for an exemplary embodiment. The timing diagram spans the initialization phase, two functional phases, two scan-shift phases, two compare phases and one diagnostic phase. In this example, an error is encountered in the second compare phase. The control signals that are illustrated include the base clock (the PLL clock signal that is gated by the test circuitry,) the I/O signal (which indicates input or output,) the function signal (which triggers function cycles, i.e., where data propagated through the functional circuitry is captured in the latches of a scan chain,) the scan signal (which triggers shifting of bits into and out of the scan chains,) and the diagnostic signal. Also illustrated is the signal to reset the MISR's.

FIG. 5 depicts an exemplary scenario in which an error is detected during a second compare and a diagnostic procedure is performed, followed by resetting the MISR and a resumption of testing. During initialization phase 501, the input test patterns are scanned into (shifted through) the scan chain latches. The number of scan chain pulses is equal to the number of latches in a scan chain (9 in this example.) At the beginning of the first test loop is functional phase 511. During this phase, input test patterns from the scan chains propagate through the functional logic and are captured in the scan chain latches. The bits are propagated from the chains preceding the functional logic, through the logic, to the chains following the functional logic. One cycle is used in functional phase 511. The functional phase is followed by a scan-shift phase 512. As noted above, the number of scan clock signal pulses is equal to the number of scan chain latches. In this example, there are nine latches requiring nine scan-shift clock cycles, but other embodiments could have N latches in each scan chain, requiring N scan-shifts.

After each scan shift signal pulse, the MISR signature values are updated. Then, during the compare phase, the signature values are combined, output and examined. If, as shown in compare phase 513, no signature differences are detected, the process continues without a diagnostic phase. In the next test loop, at compare phase 523, a difference between the expected and signature generated by the device under test is detected. At this point, the diagnostic signal is asserted and the system enters diagnostic phase 524.

During diagnostic phase 524, the 8-bit MISR space compactor block signatures are output during four successive cycles. The appropriate one of the signatures is selected by cycling a 1 (one) through the latches L1, L2, L3 and L4. As shown in FIG. 4, the MISR space compactor block signatures are AND'ed with the latch values in L1-L4, and are then OR'ed with each other. This mechanism is equivalent to a multiplexer. The result is output to the ATE. The result of the OR is 8 bits wide to match the number of I/O ports. In this embodiment, the MISR's are reset on the last cycle (when all of the MISR signatures have been output) since at least one is in error. This reset is necessary in order to ensure that the error does not affect future signature data, since each MISR accumulates its result bits.

The number of cycles needed to output the signature data may be different than the number of cycles explicitly depicted in the figure. In an alternative embodiment, the processing of the error data may include several functional and scan-shift phases to localize the defect in the logic. For example, the input pattern used to generate the error may again be generated and propagated through the functional logic. A reduced number of bits may be scanned out of the scan chains to narrow the location and indicate the specific scan chain and the latch within that scan chain containing an error. Some number of cycles may then used to process and examine the test data. In this example, diagnostic phase 524 is then followed by another test (beginning with functional phase 531).

While the foregoing description presents several specific exemplary embodiments, there may be many variations of the described features and components in alternative embodiments. For example, the test controller described above may be used to control the test circuitry in both a device under test and a good device, or a separate test controller may be used in conjunction with each of the devices. If separate test controllers are used, it may be necessary in some embodiments to synchronize the test loops so that the data generated in each test loop can be properly compared. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs,) general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising,
    test circuitry coupled to target logic under test,
        wherein the test circuitry is configured to perform logic tests on the target logic using input data and thereby generate signature data;
    a first number of shared I/O ports coupled to the test circuitry and configured to alternately convey the input data to the test circuitry and output the signature data generated by the test circuitry;
    wherein the signature data comprises a second number of bits greater than the first number of I/O ports; and
    wherein the test circuitry is configured to successively output multiple segments of the signature data through the I/O ports, wherein each segment has a third number of bits no greater than the first number of I/O ports.

2. A method implemented in a device which incorporates circuitry for logic testing comprising:
    performing one or more test loops, wherein each test loop includes
        receiving input data for testing through a first number of shared input/output (I/O) ports,
        performing testing on functional logic within the device using the input data and thereby generating test data, wherein the test data comprises a number of bits greater than the first number, and
        outputting the test data through the shared I/O ports in a plurality of successive segments, wherein each segment comprises a portion of the test data.

3. The method of claim 2, further comprising alternately operating in either a first test mode or a second test mode; wherein in the first mode, the test data is output through the shared I/O ports in a plurality of successive segments; wherein in the second mode, the test data is compacted to produce a compacted test signature which contains a number of bits no greater than the first number and wherein the compacted test signature is output through the shared I/O ports as a single value.

4. The method of claim 2, further comprising, when operating in the second mode, changing the mode to the first mode upon detecting an error in the compacted test signature.

5. The method of claim 2, further comprising generating a plurality of independent test signatures, wherein each independent test signature indicates whether a corresponding portion of the functional logic has malfunctioned.

6. The method of claim 5, wherein each independent test signature is generated by a corresponding one of a plurality of test satellites implemented in the device.

7. The method of claim 5, wherein in the first mode, each of the successive segments output through the shared I/O ports comprises one of the independent test signatures.

8. The method of claim 5, further comprising, in the second mode, compacting the independent test signatures into the compacted test signature.

9. A system comprising,
    test circuitry coupled to target logic under test,
        wherein the test circuitry is configured to perform logic tests on the target logic using input data and thereby generate signature data;

a first number of shared I/O ports coupled to the test circuitry and configured to alternately convey the input data to the test circuitry and output the signature data generated by the test circuitry;

wherein the signature data comprises a second number of bits greater than the first number of shared I/O ports; and wherein the test circuitry is configured to successively output multiple segments of the signature data through the shared I/O ports, wherein each segment has a third number of bits no greater than the first number of shared I/O ports.

10. The system of claim 9, wherein the circuitry operates alternately in a first and a second mode, wherein in the first mode, the test circuitry is configured to successively output multiple segments of the signature data through the shared I/O ports, and wherein in the second mode, the test circuitry is configured to compact the test signature data into a combined test signature having a number of bits no greater than the first number of shared I/O ports and to output a single, combined test signature.

11. The system of claim 10, further comprising test circuitry configured to trigger the first mode based on the combined test signature of the second mode.

12. The system of claim 9, wherein the test circuitry comprises a STUMPS-type architecture.

13. The system of claim 9, wherein the test circuitry includes a plurality of test satellites, and wherein each of the test satellites is configured to perform logic tests on a corresponding portion of the target logic using the input data, and to thereby generate a corresponding portion of the signature data.

14. The system of claim 13, wherein each of the test satellites comprises a STUMPS-type architecture.

15. The system of claim 14, wherein each of the test satellites comprises a corresponding set of scan chains and a multiple-input signature register (MISR), wherein in each test satellite, the MISR is configured to receive bits captured in the scan chains and to combine the bits into an test signature.

16. The system of claim 9 wherein the signature data comprises a plurality of independent signatures, wherein each of the independent signatures is associated with a corresponding portion of the target logic.

17. The system of claim 16, wherein each segment comprises one of the independent signatures.

18. The system of claim 17, further comprising a first multiplexer configured to select one of the independent signatures in the first mode and combined test signature in the second mode.

19. The system of claim 18, further comprising a second multiplexer configured to select which one of the independent signatures is output in the first mode.

* * * * *